United States Patent
Lee et al.

(10) Patent No.: US 7,951,645 B2
(45) Date of Patent: May 31, 2011

(54) POWER MODULE FOR LOW THERMAL RESISTANCE AND METHOD OF FABRICATING THE SAME

(75) Inventors: Keun-hyuk Lee, Bucheon-si (KR); O-seob Jeon, Seoul (KR); Seung-won Lim, Bucheon-si (KR)

(73) Assignee: Fairchild Korea Semiconductor, Ltd, Bucheon-si (KR)

( * ) Notice: Subject to any disclaimer, the term of this patent is extended or adjusted under 35 U.S.C. 154(b) by 0 days.

(21) Appl. No.: 12/702,615

(22) Filed: Feb. 9, 2010

(65) Prior Publication Data

US 2010/0167470 A1    Jul. 1, 2010

Related U.S. Application Data

(62) Division of application No. 11/743,829, filed on May 3, 2007, now Pat. No. 7,701,048.

(30) Foreign Application Priority Data

May 8, 2006    (KR) .................. 10-2006-0041070

(51) Int. Cl.
  *H01L 21/44* (2006.01)
(52) U.S. Cl. ........ 438/106; 438/107; 438/114; 438/178; 438/122; 438/121; 438/125; 438/127
(58) Field of Classification Search ........... 438/106–127
See application file for complete search history.

(56) References Cited

U.S. PATENT DOCUMENTS

| | | | |
|---|---|---|---|
| 5,471,089 A | 11/1995 | Nagatomo et al. | |
| 5,519,252 A | 5/1996 | Soyano et al. | |
| 5,521,437 A | 5/1996 | Oshima et al. | |
| 6,002,166 A | 12/1999 | Noda et al. | |
| 6,359,331 B1 | 3/2002 | Rinehart et al. | |
| 6,836,006 B2 | 12/2004 | Muto et al. | |
| 2007/0099289 A1* | 5/2007 | Irimia et al. | 435/287.2 |
| 2007/0145988 A1* | 6/2007 | Garabedian et al. | 324/754 |

* cited by examiner

*Primary Examiner* — Thanh V Pham
(74) *Attorney, Agent, or Firm* — Thomas R. FitzGerald, Esq.; Hiscock & Barclay, LLP

(57) ABSTRACT

A power module with low thermal resistance buffers the stress put on a substrate during a package molding operation to virtually always prevent a fault in the substrate of the module. The power module includes a substrate, a conductive adhesive layer formed on the substrate, a device layer comprising a support tab, a power device, and a passive device which are formed on the conductive adhesive layer, and a sealing material hermetically sealing the device layer. The support tab is buffers the stress applied by a support pin to the substrate, thereby virtually always preventing a ceramic layer included in the substrate from cracking or breaking. As a result, a reduction in the isolation breakdown voltage of the substrate is virtually always prevented and the failure of the entire power module is do to a reduction in the breakdown voltage of the substrate is virtually always prevented.

8 Claims, 4 Drawing Sheets

POWER MODULE FOR LOW THERMAL RESISTANCE AND METHOD OF FABRICATING THE SAME

CROSS-REFERENCE TO RELATED PATENT APPLICATIONS

This application is a divisional of U.S. patent application Ser. No. 11/743,829 filed May 3, 2007, which claims the benefit of Korean Patent Application No. 10-2006-0041070, filed on May 8, 2006, in the Korean Intellectual Property Office, the disclosure of which is incorporated herein in its entirety by reference.

BACKGROUND OF THE INVENTION

1. Field of the Invention

The present invention relates to a power module, and more particularly, to a power module for improving a substrate characteristic and a low thermal resistance characteristic.

2. Description of the Related Art

When isolated power modules are fabricated, one or two semiconductor chips are mounted on a lead frame die pad and packaged using a molding resin such as an epoxy molding compound. The epoxy molding compound is used as an isolation material and simultaneously used as a heat transfer path.

To achieve low cost, compactness, lightness, low noise, and high reliability of power conversion systems with high speed, large capacity, and high degree of integration of electronic devices, which are used in automobiles, industrial machinery, home appliance, etc., heat generated in a semiconductor chip should be efficiently discharged.

Accordingly, a direct bonding copper (DBC) substrate or an insulated metal substrate (IMS) is widely used for power modules. The DBC substrate is fabricated by pressing and bonding a copper layer to bottom and top surfaces of a ceramic insulating substrate. The top surface may be partially formed in a designed pattern. The IMS is fabricated by forming a polymer insulating layer on an aluminum substrate and forming a copper layer in a designed pattern on the polymer insulating layer.

FIG. 1A is a cross-sectional view of a power module using a conventional DBC substrate for low thermal resistance. Referring to FIG. 1A, the power module includes a conductive layer adhesive 20 disposed on a DBC substrate 10, a device layer 30 fixed by the conductive layer adhesive 20, and a sealing material 40 hermetically sealing each of devices included in the device layer 30.

As described above, the DBC substrate 10 is fabricated by bonding an upper copper layer 16 and a lower copper layer 12 to top and bottom surfaces, respectively, of a ceramic layer 14. The device layer 30 includes a passive circuit 34 and a power semiconductor device 32. The device layer 30 may also include a pad for connection to a lead line 50.

The sealing material 40 may be usually made using a molding resin, for example, epoxy, in a transfer molding process. A support pin hole 45 is formed in the sealing material 40 by a support pin pressing against the DBC substrate 10 during the transfer molding operation. The support pin is removed after the molding operation. During the molding process the flatness of the DBC substrate 10 is maintained by the support pin pressing against the DBC substrate, and the generation of a mold residue or mold flash is prevented.

However, when the support pin presses the DBC substrate 10, a stress is applied to the DBC substrate 10, which sometimes causes a fault like break of the ceramic layer 14 in the DBC substrate 10.

FIG. 1B is an enlarged perspective view of part A illustrated in FIG. 1A. Referring to FIG. 1B, a support pin 60 is pressing the DBC substrate 10. Thus, a stress induced by a compressive force is applied to the DBC substrate 10. As a result, the ceramic layer 14, which is brittle and has little ductability, sometimes partially cracks or breaks as shown in part B illustrated in FIG. 1B, thereby reducing isolation breakdown voltage. Consequently, the entire power module fails.

SUMMARY OF THE INVENTION

The present invention provides a power module for low thermal resistance, in which the possibility of occurrence of a substrate failure caused by a support pin is reduced and an economical direct bonding copper (DBC) substrate is provided, and a method of fabricating the power module is shown.

According to an aspect of the present invention, there is provided a power module for low thermal resistance. The power module includes a substrate; a conductive adhesive layer formed on the substrate; a device layer comprising a support tab, a power device, and an RLC device which are formed on the conductive adhesive layer; and a sealing material hermetically sealing the device layer.

The substrate may be a low thermal resistance substrate formed using DBC, a ceramic material, or an insulated metal. The substrate may be a DBC substrate including a lower copper layer, a ceramic layer, and an upper copper layer and the ceramic layer may include at least one material among aluminum oxide ($Al_2O_3$), aluminum nitride (AlN), beryllium oxide (BeO), and silicon nitride (SiN). The ceramic layer may have a thickness of 0.1 through 1 mm and preferably 0.1 through 0.4 mm. Each of the upper and lower copper layers may have a thickness of 50 through 400 µm.

A horizontal cross section of the support tab may have a polygonal shape, a circular shape, or an oval shape and a thickness of 0.1 through 5 mm and an area of 0.1 $mm^2$ through 1 $cm^2$. The support tab may be formed using a material, for example, a metal such as copper, aluminum, or iron, acting as a buffer against a mechanical stress on the substrate.

The support tab may be formed at a portion corresponding to a support pin, which presses the substrate during a process of forming the sealing material to maintain flatness of the substrate and remove mold flash in order to buffer a stress applied by the support pin to the substrate and to virtually always prevent the substrate from breaking.

According to another aspect of the present invention, there is provided a method of fabricating a power module for low thermal resistance. The method includes forming an adhesive layer on a substrate using a conductive adhesive; forming a device layer comprising a power device, an RLC device, and a support tab on the adhesive layer; forming wiring for each of the devices in the device layer; and forming a sealing material hermetically sealing the device layer.

The device layer may be formed using a pick-and-place machine that is an automatic mounting machine. The sealing material may be formed using transfer molding. The adhesive layer may be formed using solder and screen printing.

The substrate and the support tab may be formed in the above-mentioned sizes using the above-mentioned materials. The support tab may be formed at a portion corresponding to a support pin, which presses the substrate during a process of forming the sealing material to maintain flatness of the substrate and remove mold flash, thereby buffering a stress applied by the support pin to the substrate and virtually always preventing the substrate from breaking.

The power module may be used for various types of power module such as a smart power module (SPM), a plasma display panel (PDP) module, and an insulated gate bipolar transistor (IGBT) module.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
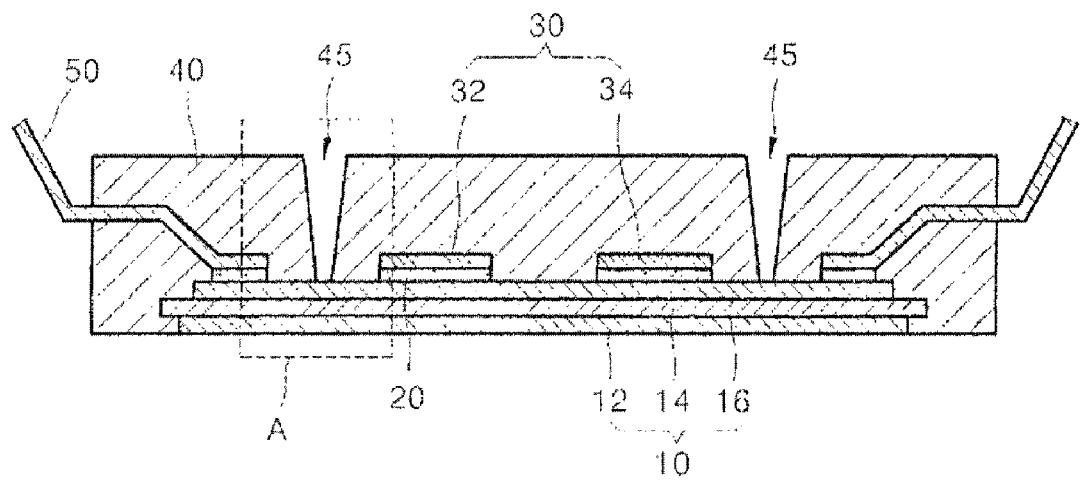
FIG. 1A is a cross-sectional view of a conventional power module for low thermal resistance.
Figure 1B:
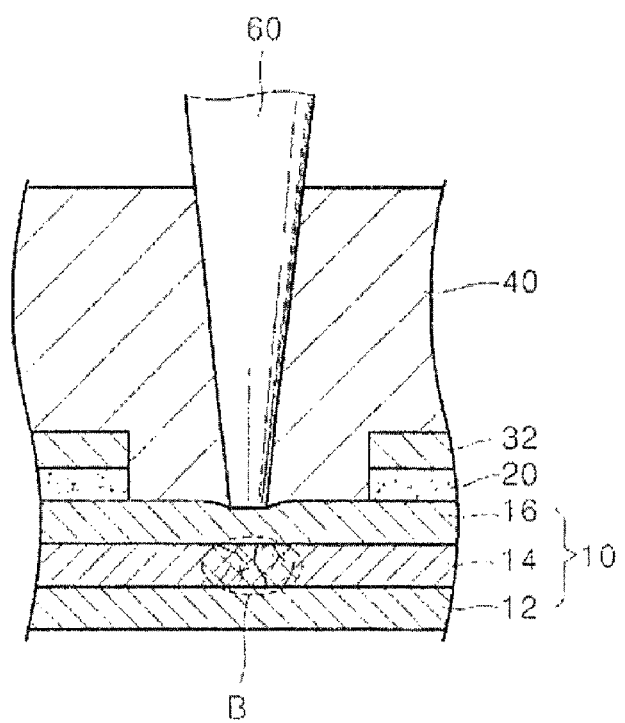
FIG. 1B is an enlarged perspective view of part A illustrated in FIG. 1A.

The present invention will now be described more fully with reference to the accompanying drawings, in which exemplary embodiments of the invention are shown. It will also be understood that when a layer is referred to as being "on" another layer or substrate, it can be directly on the other layer or substrate, or intervening layers may also be present. In the drawings, the thicknesses or sizes of some of the elements are exaggerated for clarity and like reference numerals in the drawings denote like elements. The invention may be embodied in many different forms and should not be construed as being limited to the embodiments set forth herein; rather, these embodiments are provided so that this disclosure will fully convey the concept of the invention to those skilled in the art.

Figure 2:
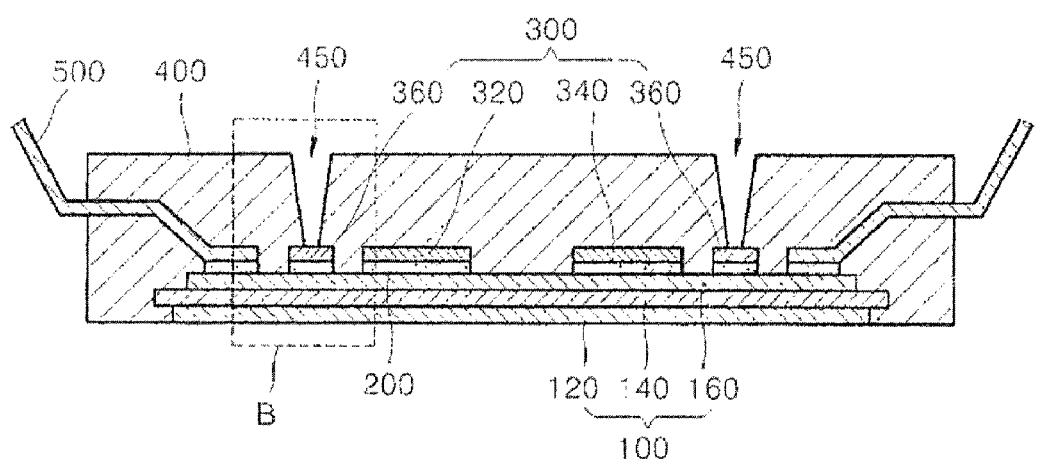
FIG. 2 is a cross-sectional view of a power module for low thermal resistance according to an embodiment of the present invention.

FIG. 2 is a cross-sectional view of a power module for low thermal resistance according to an embodiment of the present invention. Referring to FIG. 2, the power module includes a substrate 100, an adhesive layer 200 disposed on the substrate 100, a device layer 300 fixed on the adhesive layer 200, and a sealing material 400 hermetically sealing the device layer 300.

In the current embodiment, the substrate 100 is a direct bonding copper (DBC) substrate formed by bonding an upper copper layer 160 and a lower copper layer 120 to top and bottom surfaces, respectively, of a ceramic layer 140, but the present invention is not restricted thereto. For example, a ceramic substrate or an insulated metal substrate (IMS) may be used.

The ceramic layer 140 may include at least one material among aluminum oxide ($Al_2O_3$), aluminum nitride (AlN), beryllium oxide (BeO), and silicon nitride (SiN) and may be formed to a thickness of 0.1 through 1 mm and preferably a thickness of 0.1 through 0.4 mm. Each of the upper and lower copper layers 160 and 120 may be formed to a thickness of about 50 through 400 μm.

Usually, expensive AlN is used to form a conventional ceramic layer of a DBC substrate. In the current embodiment, the ceramic layer 140 may be formed using a cheap $Al_2O_3$ material. In addition, while the conventional ceramic layer is required to have a thickness of at least 0.63 mm, the ceramic layer 140 may have a thickness of less than 0.63 mm in the current embodiment of the present invention. As a result, the entire thickness of the power module of the present invention can be reduced. Such characteristics are due to the existence of a support tab, which will be described later.

The adhesive layer 200 is usually formed by screen printing an electrically and thermally conductive adhesive, for example, solder, on a top surface of the substrate 100. The adhesive layer 200 is a patterned adhesive layer formed only separate regions, to which devices will be attached.

The device layer 300 includes a power device 320, a passive device 340, and a support tab 360. The passive device 340 may be a resistor, an inductor, or a capacitor or a combination thereof. The power device 320 may be a semiconductor device such as a power transistor. The device layer 300 may further include a pad for connection (not shown) to an external lead 500.

The support tab 360 is formed to lie at the bottom of a support pin hole 450 formed in the sealing material 400. It may be formed using a ductile metal such as copper, aluminum, or iron. When the support tab 360 is formed, mechanical stress due to a support pin is partially absorbed by the support tab 360 and the full mechanical stress is not being applied to the substrate 100, and therefore, the ceramic layer 140 is much less likely to crack or break during the molding operation.

In detail, a support pin usually presses the substrate 100 during a molding process, i.e., a process of forming the sealing material 400, in order to maintain the flatness of the substrate 100 and remove mold flash. The support pin applies a compressive force to the substrate 100 and the ceramic layer 140 of the substrate 100 may crack or break due to a strain induced by the compressive force. Conventionally, to prevent the ceramic layer 140 from cracking or breaking and to obtain low thermal resistance, the ceramic layer 140 is formed to a thickness of at least 0.63 mm using an expensive AlN material. However, in the current embodiment, the support tab 360 acts as a buffer against the stress applied to the substrate 100, thereby lessen the mechanical stress to the ceramic layer 140 to substantially prevent the ceramic layer 140 from cracking or breaking. Accordingly, the ceramic layer 140 may be formed using a less expensive $Al_2O_3$ material and the thickness thereof may be reduced remarkably.

The support tab 360 may be formed in various shapes such as a polygon, a circle, or an oval having a thickness of about 0.1 through 5 mm and an area of 0.1 $mm^2$ through 1 $cm^2$.

The sealing material 400 may be formed by transfer molding of a synthetic resin such as a molding resin, for example, epoxy. The material and molding method for the sealing material 400 are not restricted to the above and the sealing material 400 may be formed using other various materials and molding methods. The sealing material 400 isolates devices from each other in the device layer 300 and serves as a path for heat discharge.

The support pin hole 450 is formed in a portion in the sealing material 400 where a support pin (not shown) is placed during the molding process in order to maintain the flatness of the substrate 100 and to prevent the generation of mold flash. The support pin hole 450 may be filled in after the molding operation.

Figure 3A:
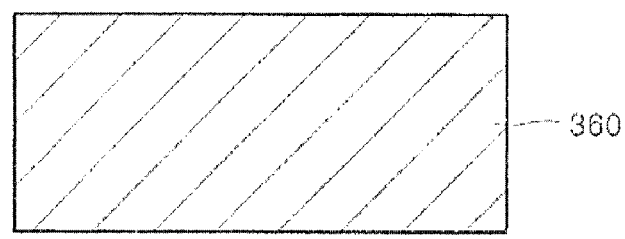
FIGS. 3A through 3C are plane views illustrating various shapes of a horizontal cross section of a support tab that can be used in the power module illustrated in FIG. 2.
Figure 3B:
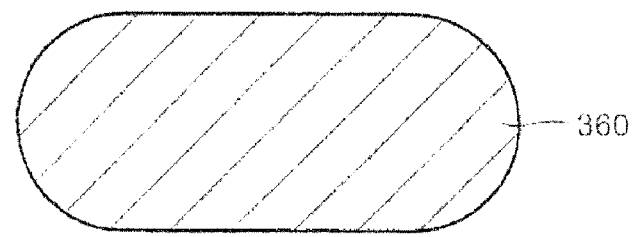
Figure 3C:
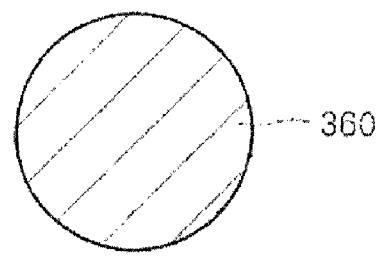

FIGS. 3A through 3C are plan views illustrating various shapes of a horizontal cross section of the support tab 360 that can be used in the power module illustrated in FIG. 2. Referring to FIG. 3A, the horizontal cross section of the support tab 360 has a rectangular shape. Referring to FIG. 3B, the horizontal cross section of the support tab 360 has an oval shape. Referring to FIG. 3C, the horizontal cross section of the support tab 360 has a circular shape.

These shapes of the support tab 360 are just examples and the support tab 360 with the horizontal cross section in other various shapes may be used for the power module according to the current embodiment. The shape and the thickness of the support tab 360 will be appropriately selected considering the characteristics and the materials of the power module, for example the material and the thickness of the ceramic layer 140 of the substrate 100.

In the power module for low thermal resistance according to the current embodiment, the support tab 360 is formed at a portion corresponding to a support pin and acts as a buffer against a stress on the substrate 100, thereby virtually always preventing the ceramic layer 140 from cracking or breaking. Accordingly, the power module according to the current embodiment is advantageous in terms of selection of a material of the ceramic layer 140 and in reducing the thickness of the ceramic layer 140. In addition, the power module virtually always prevents a reduction in the isolation breakdown voltage, improves a process margin, and increases process reliability and mass productivity. Due to these advantages, the power module having high quality can be fabricated at low cost. Such power module can be used for various types of power module such as a smart power module (SPM), a plasma display panel (PDP) module, and an insulated gate bipolar transistor (IGBT) module.

FIGS. 4A through 4D are cross-sectional views of a power module for low thermal resistance during stages of a method of fabricating the power module, according to an embodiment of the present invention.

Figure 4A:
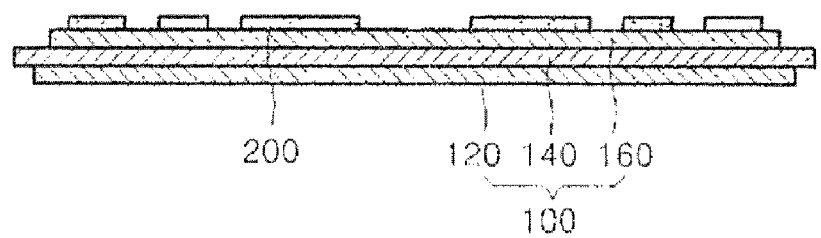
FIGS. 4A through 4D are cross-sectional views of a power module for low thermal resistance during stages of a method of fabricating the power module, according to an embodiment of the present invention.

Referring to FIG. 4A, the adhesive layer 200 is formed by screen printing a conductive adhesive such as solder on the DBC substrate 100. In the current embodiment, although the DBC substrate 100 is used, a pure ceramic substrate or an IMS may also be used.

The DBC substrate 100 is formed by bonding the upper and lower copper layers 160 and 120 to the ceramic layer 140. The ceramic layer 140 may be formed to a thickness of 0.1 through 1 mm and preferably 0.1 through 0.4 mm using at least one material among $Al_2O_3$, AlN, BeO, and SiN. Each of the upper and lower copper layers 160 and 120 may be formed to a thickness of 50 through 400 μm.

Figure 4B:
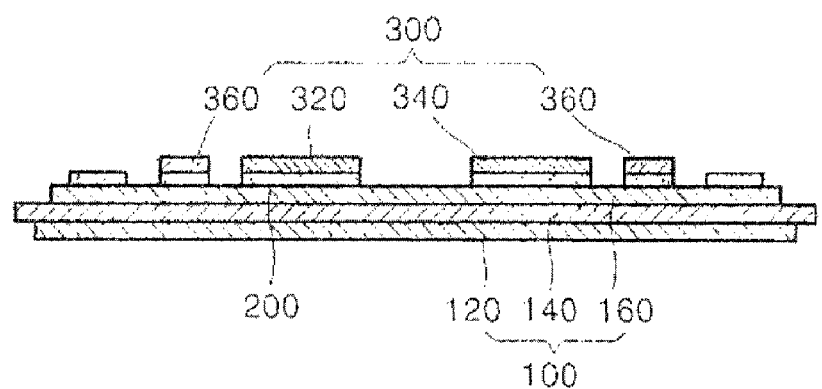

Referring to FIG. 4B, after the adhesive layer 200 is formed, the device layer 300 is formed on the adhesive layer 200. The device layer 300 includes the power device 320, the RLC device 340, and the support tab 360. The device layer 300 is bonded and fixed to the adhesive layer 200 using an automatic mounting machine, i.e., a pick-and-place machine.

The support tab 360 is formed on a portion of the substrate 100 corresponding to a place where a support pin will press the substrate 100 during a molding process. The support tab 360 is formed using a ductile metal such as copper, aluminum, or iron and may have various horizontal cross sections such as a polygon, a circle, or an oval and have a thickness of about 0.1 through 5 mm and an area of 0.1 $mm^2$ through 1 $cm^2$.

Figure 4C:
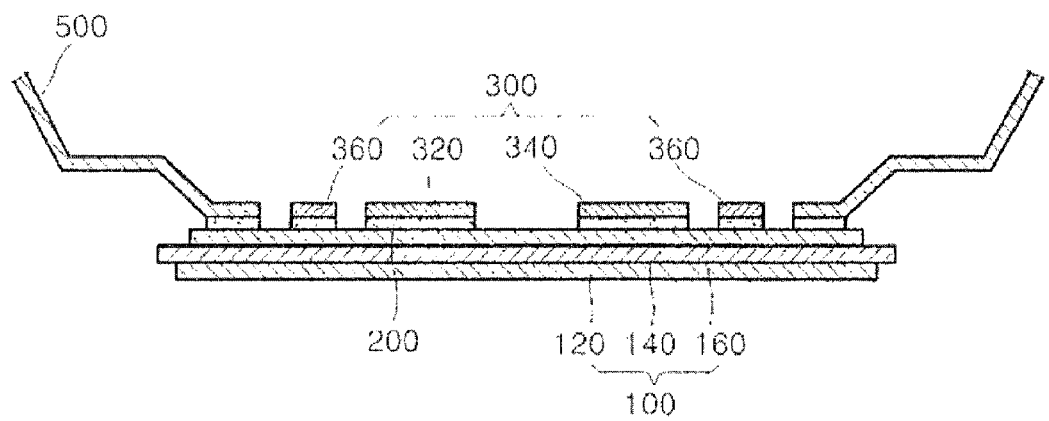

Referring to FIG. 4C, wiring is formed for each of the devices 320 and 340 included in the device layer 300 and the lead line 500 is connected the devices 320 and 340 in a wire bonding and electric wiring process.

Figure 4D:
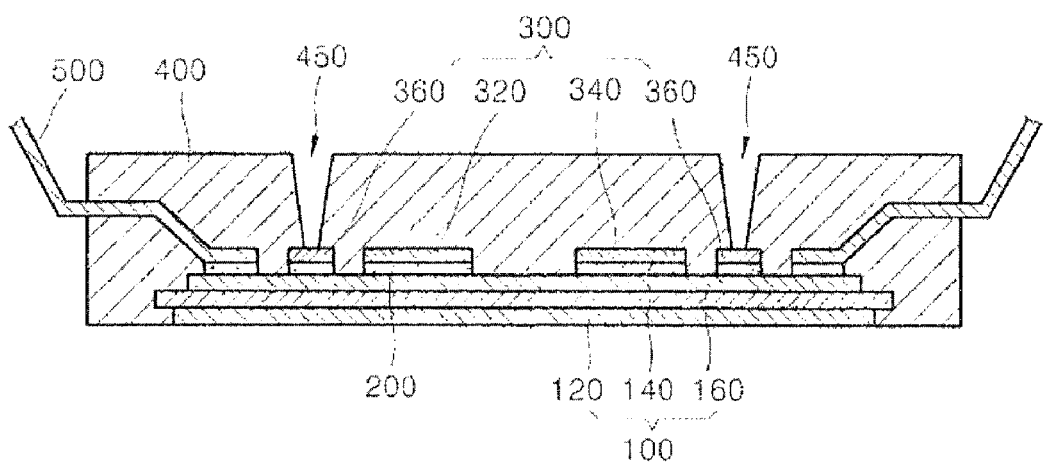

Referring to FIG. 4D, the sealing material 400 is formed to hermetically seal the device layer 300. The sealing material 400 may be formed using a transfer molding method, but the present invention is not restricted thereto. When the support pin 60, which press against the substrate 100 during the molding process while the sealing material 400 is formed, is removed, the support pin hole 450 is formed in the sealing material 400. The support tab 360 is located below the support pin hole 450. As mentioned above, the support pin hole 450 may be completely removed by filling in the support pin hole 450 with additional sealing material.

Thereafter, typical processes such as a trimming process and an additional forming process to fabricate a conventional power module are performed. The description thereof is well known in the art and therefore will be omitted.

In the method of fabricating a power module for low thermal resistance according to the current embodiment, the support tab 360 is formed at a location corresponding to the placement of a support pin 60 and buffers a stress applied by the support pin onto the substrate 100, thereby virtually always preventing the ceramic layer 140 of the substrate 100 from cracking or breaking. Accordingly, the method according to the current embodiment is advantageous in providing a wide range of selection of a material and a thickness of the ceramic layer 140. In addition, the method improves a process margin and increases process reliability and mass productivity. Due to these advantages, a power module having high quality can be fabricated at low cost. Such power module can be used for various types of power module such as an SPM, a PDP module, and an IGBT module.

As described above, according to the present invention, a support tab is formed to buffer a stress applied by a support pin to a substrate, thereby virtually always preventing a ceramic layer included in the substrate from cracking or breaking. As a result, a reduction in the isolation breakdown voltage of the module 10 is virtually always prevented and the failure of an entire power module is virtually always prevented. In addition, since the ceramic layer is virtually always prevented from cracking or breaking due to the support tab, the ceramic layer can be used with a cheap $Al_2O_3$ material and the thickness thereof can be reduced. Accordingly, a thin and high-quality power module for low thermal resistance can be fabricated at low cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a power module for low thermal resistance, the method comprising:
    forming an adhesive layer on a substrate using a thermally conductive adhesive;
    forming a device layer comprising a power device, a passive device, and a support tab on the adhesive layer;
    forming wiring for each of the power device and the passive device in the device layer;
    forming a sealing material hermetically sealing the device layer.

2. The method of claim 1, wherein the device layer is formed using a pick-and-place machine.

3. The method of claim 1, wherein the sealing material is formed using transfer molding.

4. The method of claim 1, wherein the support tab is placed between the support pin and the substrate and buffers a stress induced by the support pin virtually always prevents the substrate from breaking.

5. The method of claim 1, wherein the support tab is formed using a material which acts as a buffer against a mechanical stress induced by the support pin on the substrate.

6. The method of claim 5, wherein the support tab is formed using a ductile metal.

7. The method of claim 1, wherein the substrate is formed with a lower copper layer, a ceramic layer, and an upper copper layer and the ceramic layer is formed from at least one material selected from the group consisting of aluminum oxide ($Al_2O_3$), aluminum nitride (AlN), beryllium oxide (BeO), and silicon nitride (SiN).

8. The method of claim 1, wherein the adhesive layer is formed using solder and screen printing.

* * * * *